US007643286B2

(12) United States Patent  (10) Patent No.: US 7,643,286 B2
Hirai et al.  (45) Date of Patent: Jan. 5, 2010

(54) SYMMETRIC MULTIPROCESSING COMPUTER AND STAR INTERCONNECTION ARCHITECTURE AND COOLING SYSTEM THEREOF

(75) Inventors: Tomonori Hirai, Taoyuan (TW); Mario J. D. Lee, Taoyuan (TW); Jyh-Ming Jong, Taoyuan (TW)

(73) Assignee: Mitac International Corp., Taoyuan (TW)

( * ) Notice: Subject to any disclaimer, the term of this patent is extended or adjusted under 35 U.S.C. 154(b) by 125 days.

(21) Appl. No.: 11/877,896

(22) Filed: Oct. 24, 2007

(65) Prior Publication Data

US 2009/0109610 A1 Apr. 30, 2009

(51) Int. Cl.
*H05K 7/20* (2006.01)
*H05K 5/00* (2006.01)
(52) U.S. Cl. .............................. 361/679.5; 361/679.48; 361/694; 361/695; 361/721; 361/788; 361/796; 361/803; 454/184
(58) Field of Classification Search ................................. 361/679.46–679.51, 690, 694–695, 719–720, 361/724–727, 788, 796–797, 803, 813, 721; 165/80.3; 174/16.1, 252; 312/223.2, 236; 454/184–186
See application file for complete search history.

(56) References Cited

U.S. PATENT DOCUMENTS

| | | | | |
|---|---|---|---|---|
| 3,550,681 A * | 12/1970 | Scaboo et al. | ............... | 165/80.3 |
| 4,708,660 A * | 11/1987 | Claeys et al. | .................. | 439/65 |
| 4,818,241 A * | 4/1989 | Smoot | ......................... | 439/65 |
| 5,887,158 A * | 3/1999 | Sample et al. | ................ | 716/15 |
| 6,392,142 B1 * | 5/2002 | Uzuka et al. | ................ | 174/541 |
| 6,422,876 B1 * | 7/2002 | Fitzgerald et al. | ............. | 439/61 |
| 6,485,309 B2 * | 11/2002 | Edholm | ....................... | 439/61 |
| 6,538,899 B1 * | 3/2003 | Krishnamurthi et al. | .... | 361/788 |
| 6,608,762 B2 * | 8/2003 | Patriche | ...................... | 361/788 |
| 6,711,028 B2 * | 3/2004 | Iny | ............................. | 361/788 |
| 6,903,939 B1 * | 6/2005 | Chea et al. | ................... | 361/788 |
| 7,193,861 B2 * | 3/2007 | Uzuka et al. | ................ | 361/786 |
| 7,280,356 B2 * | 10/2007 | Pfahnl et al. | ................ | 361/695 |
| 2006/0126292 A1 * | 6/2006 | Pfahnl et al. | ................ | 361/695 |
| 2007/0230118 A1 * | 10/2007 | Leija et al. | .................. | 361/690 |

* cited by examiner

*Primary Examiner*—Jayprakash N Gandhi
*Assistant Examiner*—Robert J Hoffberg
(74) *Attorney, Agent, or Firm*—Quintero Law Office

(57) ABSTRACT

A symmetric multiprocessor computer is provided with a star interconnection architecture and a cooling system. The star interconnection architecture include a middle plane, and plural first processor boards and second processor boards configured vertically onto opposite surfaces of the middle plane. The first processor boards and the second processor boards are crisscross to each other at the opposite surfaces of the middle plane. The cooling system includes a first cooling module and a second cooling system module configured for generating a plurality of first airflows and second airflows for the first processor boards and the second processor boards respectively, wherein the paths of the first airflows and the second airflows are crisscross to each other at the opposite surfaces of the middle plane.

18 Claims, 10 Drawing Sheets

SYMMETRIC MULTIPROCESSING COMPUTER AND STAR INTERCONNECTION ARCHITECTURE AND COOLING SYSTEM THEREOF

FIELD OF INVENTION

The present invention relates to symmetric multiprocessing (SMP) system, and more particularly, to a SMP computer with a star interconnection architecture and a cooling system configured thereof.

BACKGROUND

The challenge to build a large symmetric multiprocessor (SMP) computer is many interconnections are required. These interconnections connect each CPU (central processing unit) with every other CPU over a short distance. This creates a three dimensional nest of interconnects; each of interconnects are required to be shorter than a maximum trace length dictated by electrical performance requirements.

One approach to connect all the CPUs together is to create a backplane with all the CPUs (generally the CPUs are configured on several CPU boards/cards) connect to a same side of this backplane. Due to the requirements of maximum trace length, the CPUs (or CPU boards/cards) have to be placed very close to each other. The overall number of CPUs included in the system is dictated by the maximum allowable trace length. That is because each additional CPU (or CPU board/card) added to the backplane connection also increases the trace length between CPUs.

Another approach in the prior art to meet the aforesaid requirements is to use orthogonal connectors that allow each CPU board to connect to another CPU board in a right angle fashion. Currently, such connectors of this type available include connectors of Molex I-Trac and Amphenol-TCS (Teradyne). Not only are these connectors more expensive than traditional backplane connectors, these connectors also created a difficult cooling problem. When boards are placed in an orthogonal fashion, it creates a crisscross airflow path that makes it very difficult to bring cooling air into the system and guide warm air away from the components.

SUMMARY

To solve the prior art problems mentioned above, the present invention provides a symmetric multiprocessor computer with a star interconnection architecture and a cooling system.

In an embodiment of the present invention, the star interconnection architecture include a middle plane, and plural first processor boards and second processor boards configured orthogonally onto opposite surfaces of the middle plane. The first processor boards and the second processor boards are crisscross to each other at the opposite surfaces of the middle plane. The cooling system includes a first cooling module and a second cooling system module configured for generating a plurality of first airflows and second airflows for the first processor boards and the second processor boards respectively, wherein the paths of the first airflows and the second airflows are crisscross to each other at the opposite surfaces of the middle plane.

The new interconnect design allows traditional, lower cost backplane connectors to be used in high performance crisscross or orthogonal configuration and still take advantage of the shorter trace lengths offered by more expensive orthogonal connectors.

These and other features, aspects, and advantages of the present invention will become better understood with reference to the following description and appended claims. It is to be understood that both the foregoing general description and the following detailed description are by examples, and are intended to provide further explanation of the invention as claimed.

BRIEF DESCRIPTION OF THE DRAWINGS

The present invention can be more fully understood by reference to the following description and accompanying drawings, in which.

DETAILED DESCRIPTION

Figure 1A:
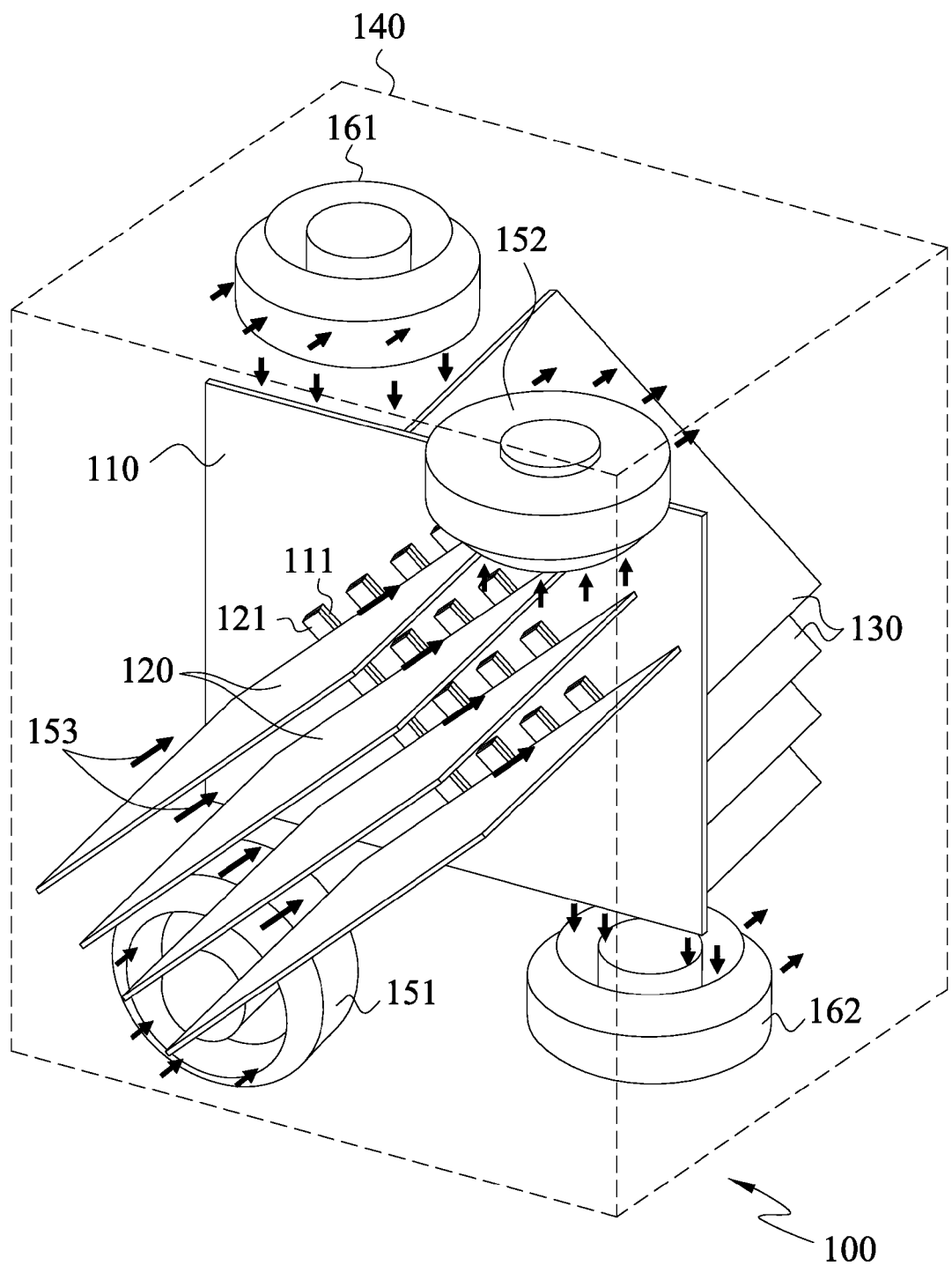
FIG. 1A is a schematic perspective view (front) for a first embodiment of the present invention, which illustrates a SMP computer with a star interconnection architecture and a cooling system configured thereof.

Reference will now be made in detail to the present preferred embodiments of the invention, examples of which are illustrated in the accompanying drawings. Wherever possible, the same reference numbers are used in the drawings and the description refers to the same or the like parts.

Figure 1B:
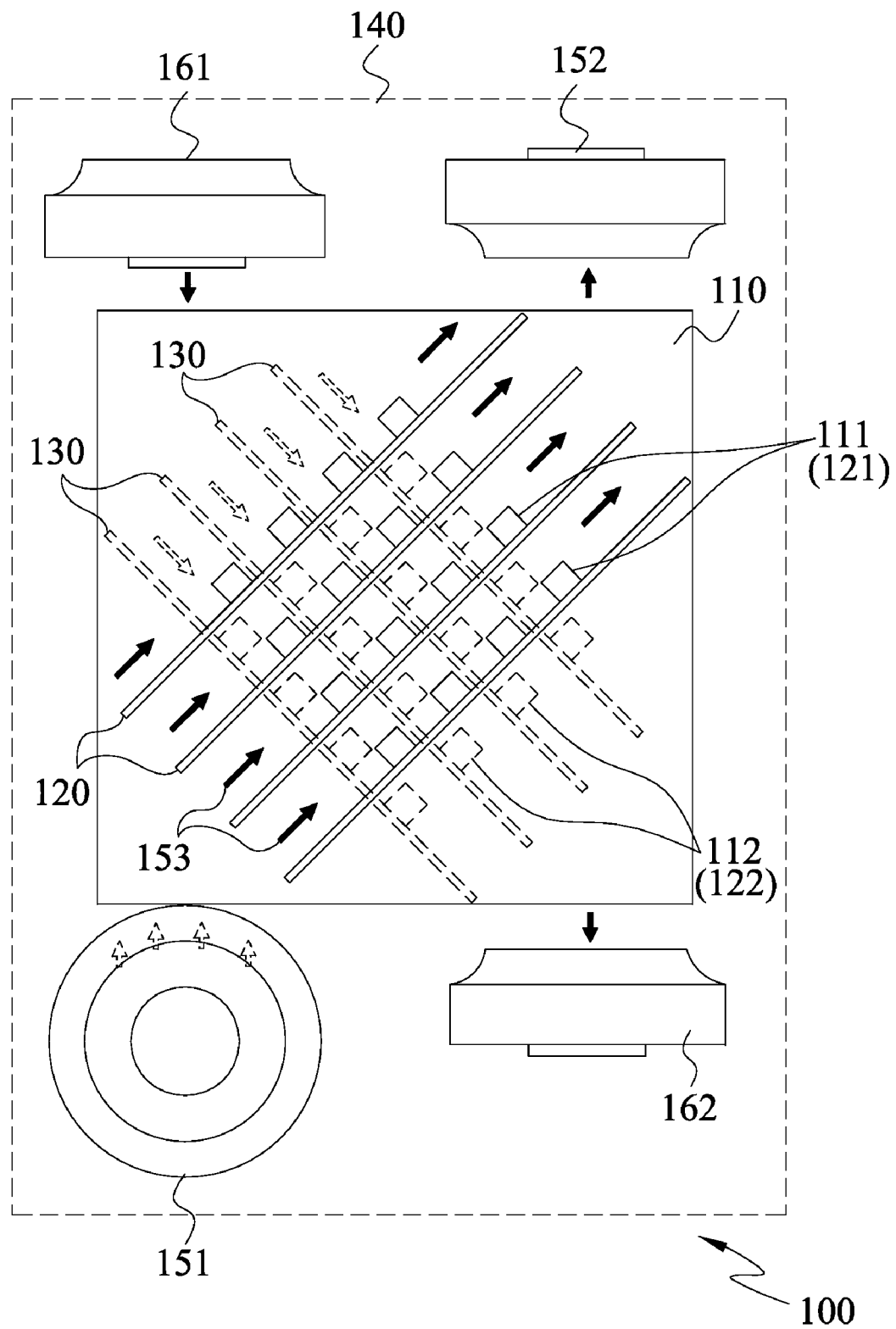
FIG. 1B is a schematic front view for FIG. 1A.
Figure 2A:
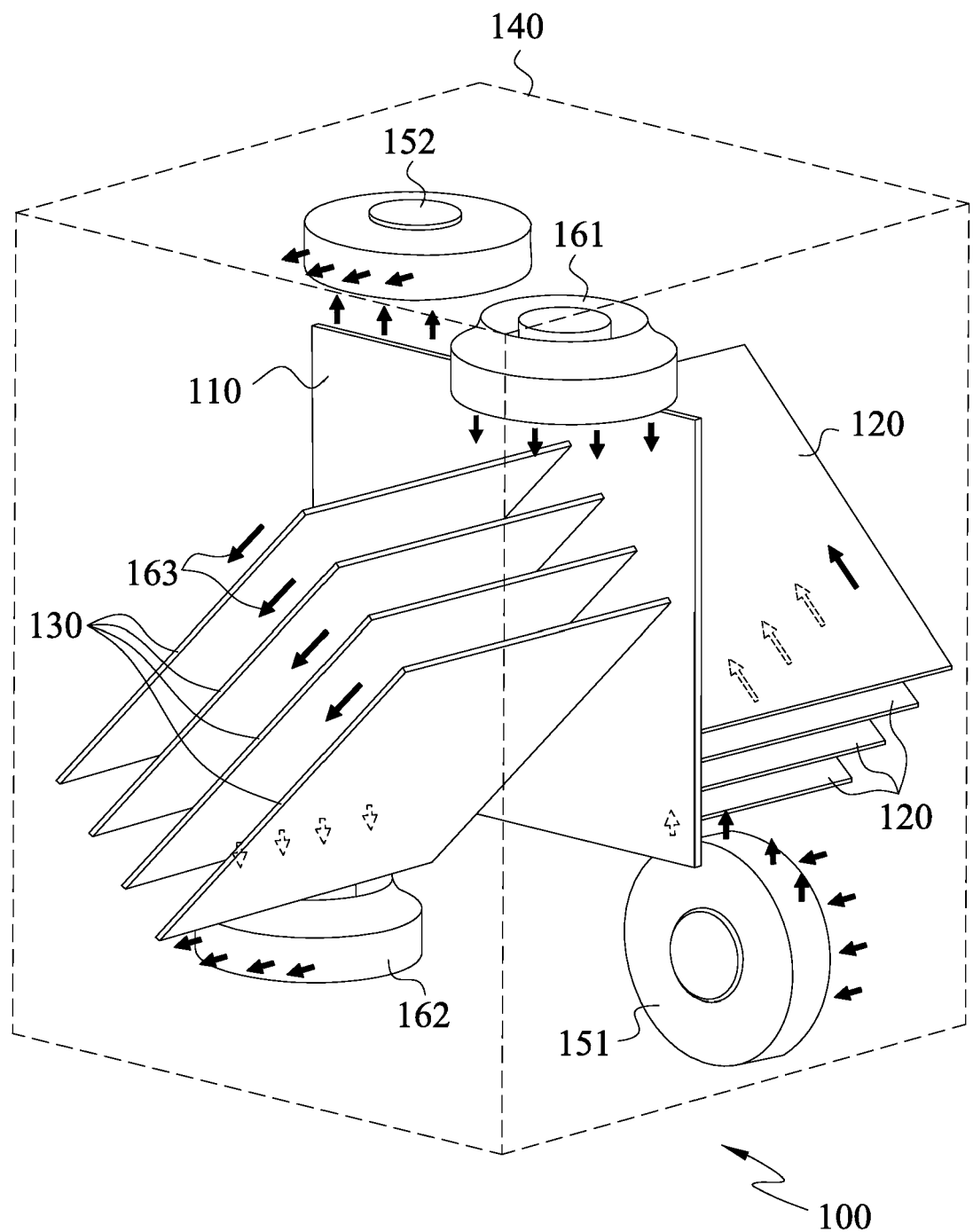
FIG. 2A is another schematic perspective view (rear) for the SMP computer illustrated in the first embodiment of the present invention.
Figure 2B:
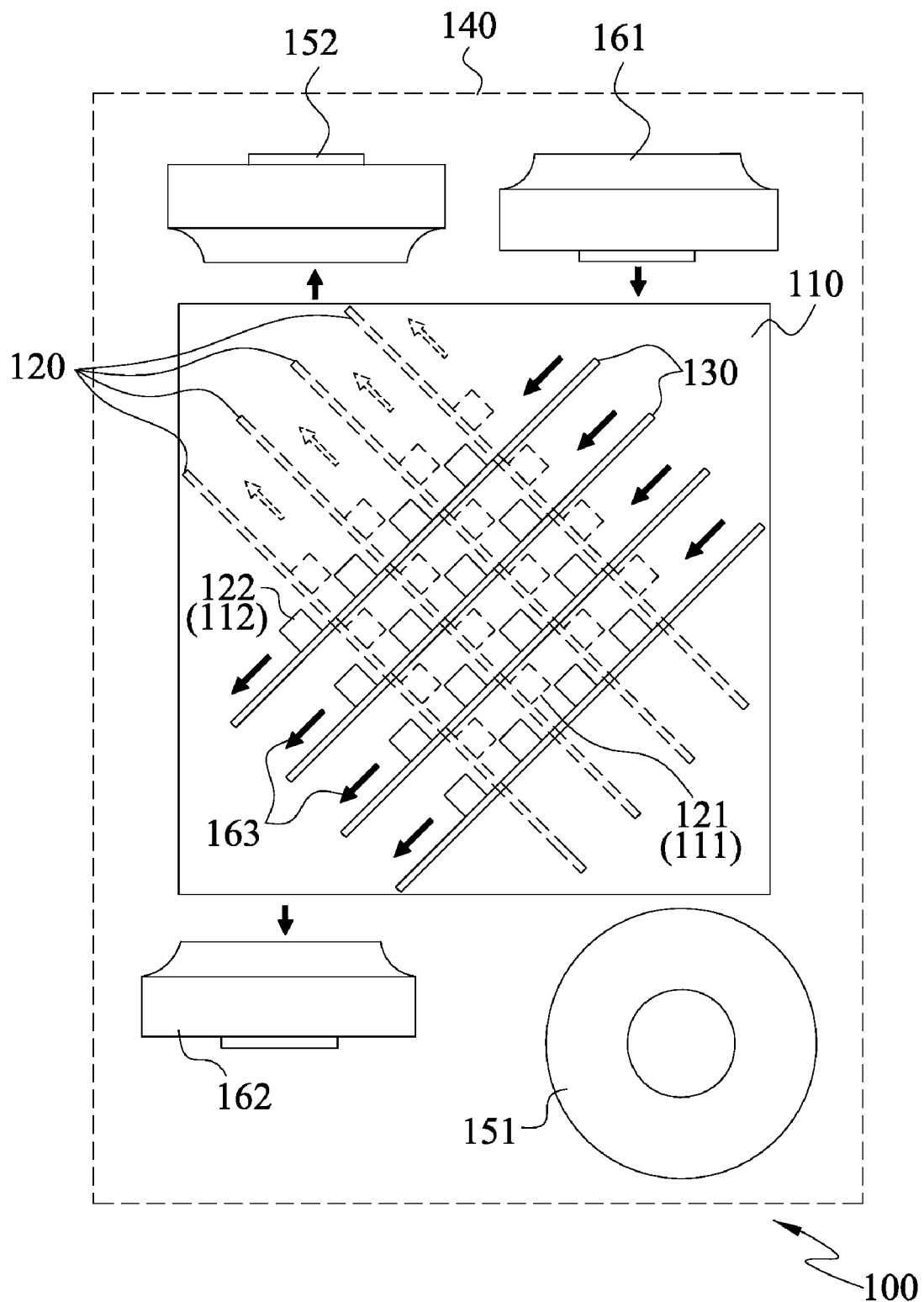
FIG. 2B is a schematic rear view for the SMP computer illustrated in the first embodiment of the present invention.
Figure 3A:
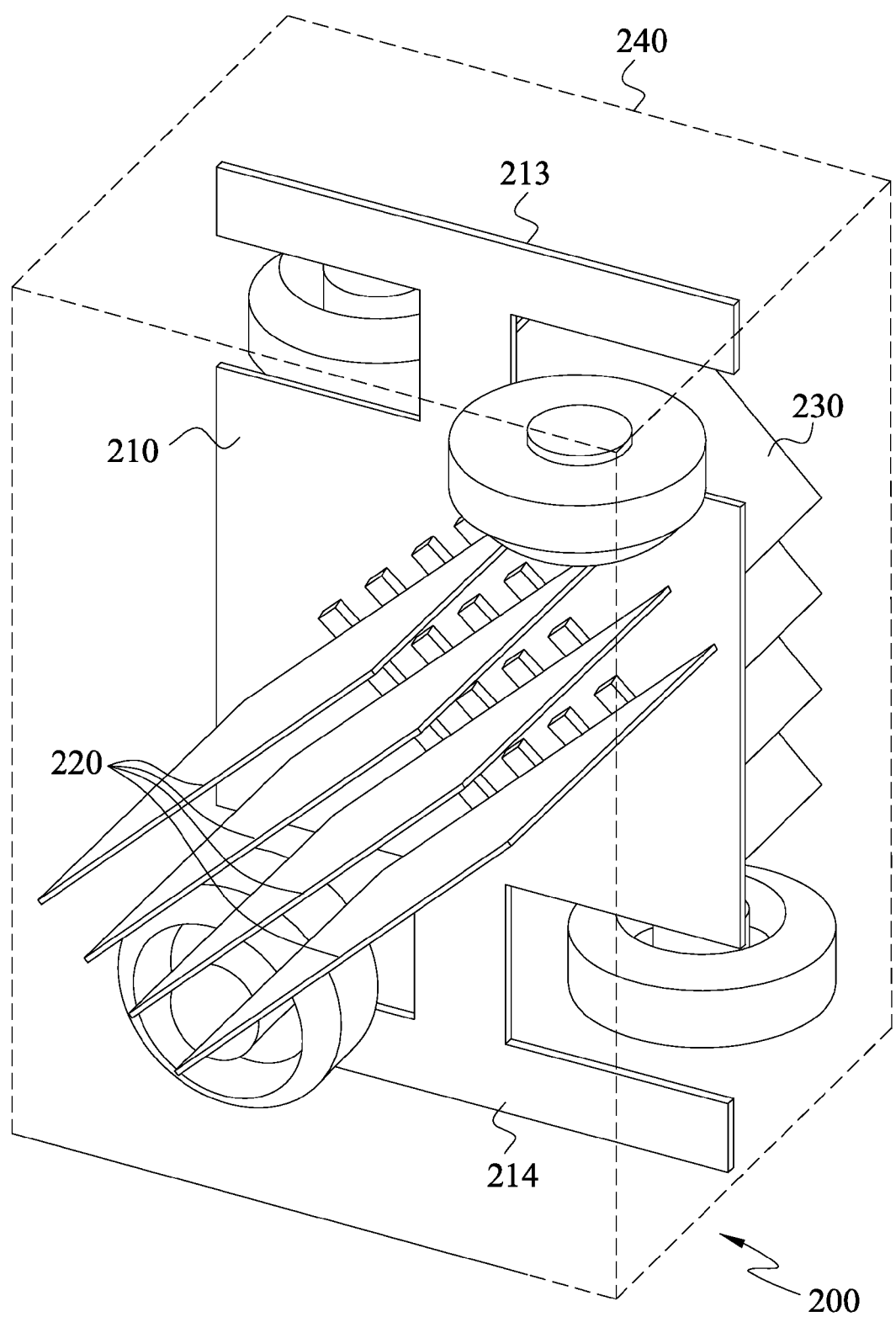
FIG. 3A is a schematic perspective view (front) for a second embodiment of the present invention, which illustrates a SMP computer with a star interconnection architecture and a cooling system configured thereof.
Figure 3B:
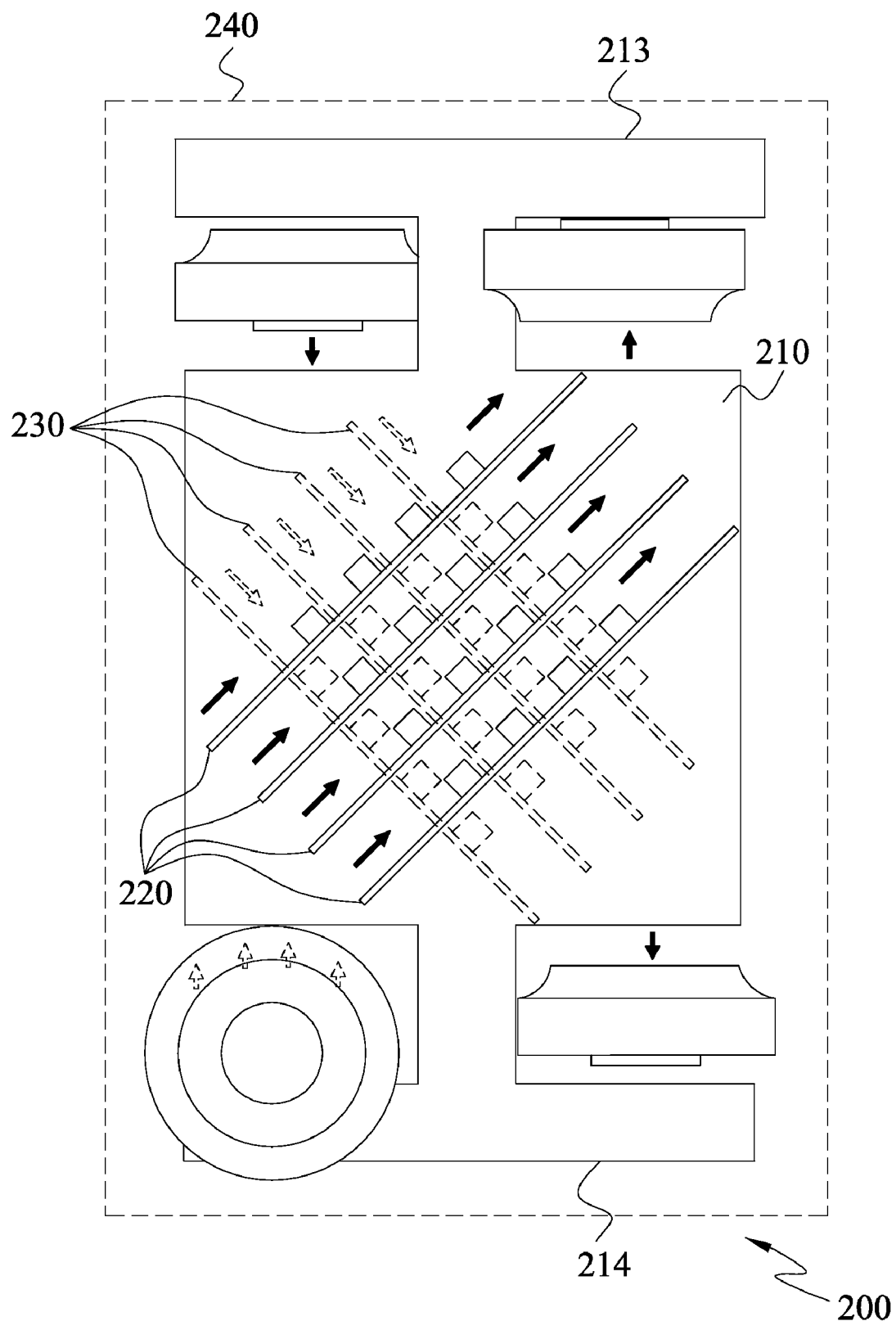
FIG. 3B is a schematic front view for FIG. 3A.
Figure 4A:
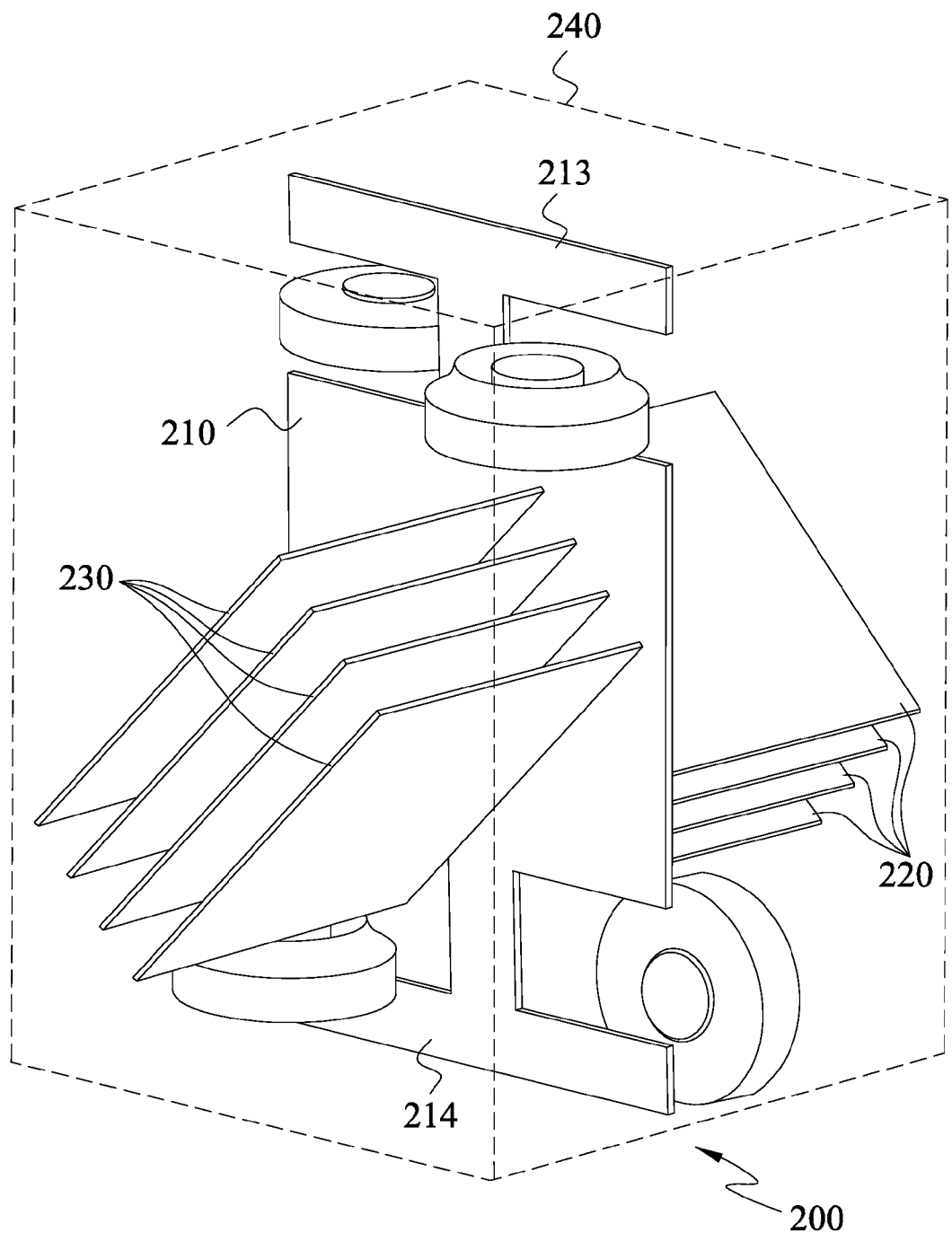
FIG. 4A is another schematic perspective view (rear) for the SMP computer illustrated in the second embodiment of the present invention.
Figure 4B:
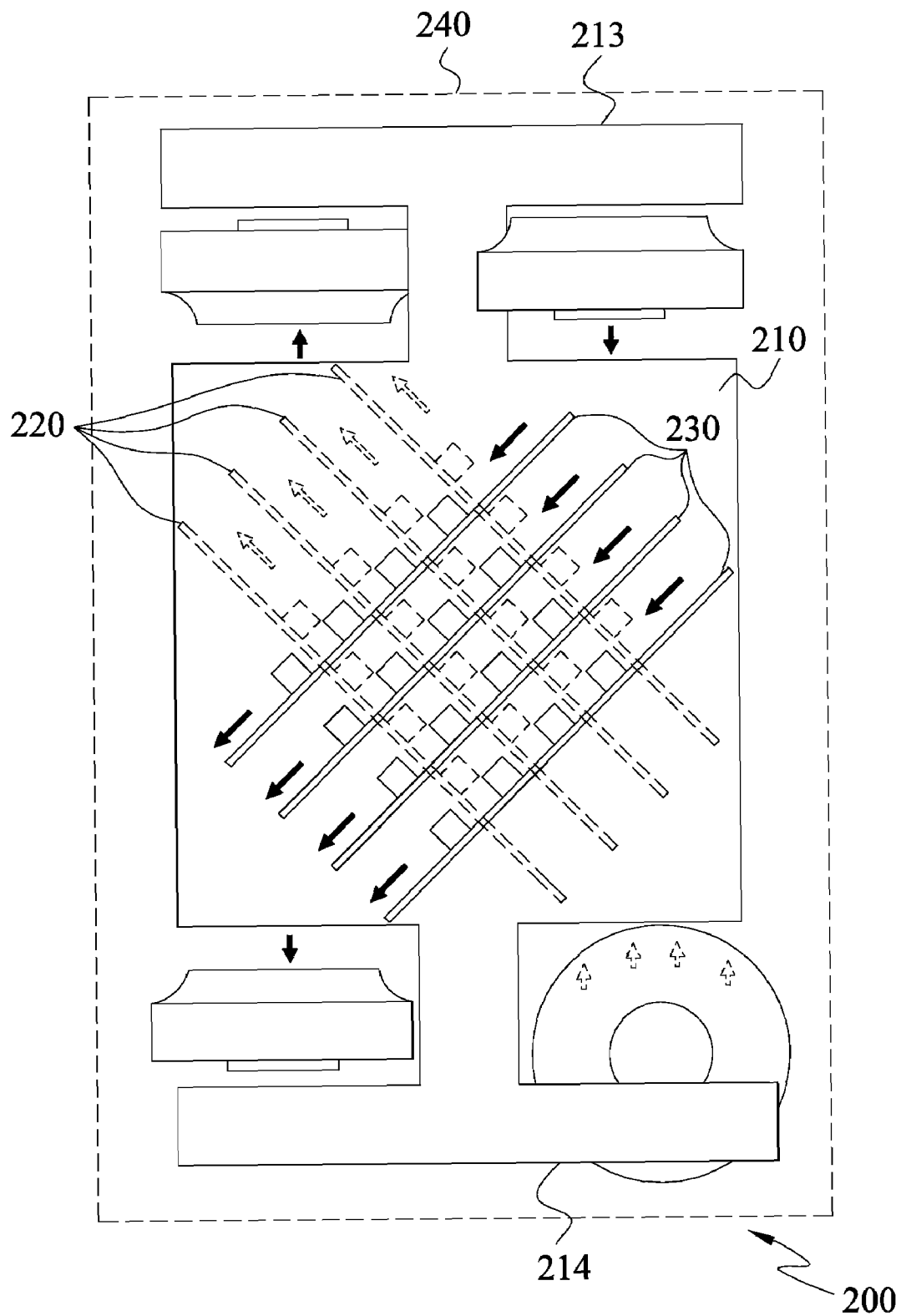
FIG. 4B is a schematic rear view for the SMP computer illustrated in the second embodiment of the present invention.

Please refer to FIGS. 1A and 1B, showing a symmetric multiprocessing (SMP) computer 100 according to a first embodiment of the present invention. FIG. 1A is a schematic perspective view (front) for the SMP computer 100. FIG. 1B is a schematic front view for the SMP computer 100. FIG. 2A is another schematic perspective view (rear) for the SMP computer 100. And FIG. 2B is a schematic rear view of FIG. 1A for the SMP computer 100.

The SMP computer 100 mainly includes a star interconnection architecture (not marked) and a cooling system (not marked) configured in a housing 140.

The star interconnection architecture mainly includes a middle plane 110, plural first processor boards 120 and plural second processor boards 130, all configured operatively inside the housing 140. The housing 140 basically provides necessary frameworks (not shown) for the star interconnection architecture to support a solid interconnecting strength. In FIGS. 1A~2B, the middle plane 100, the first processor boards 120 and the second processor boards 130 are all rectangular printed circuit boards. The first processor boards 120 are configured in parallel to each other and connected orthogonally onto a front surface of the middle plane 110. Each of the first processor boards 120 has at least one first processor (not shown) configured thereon. Similarly, the second processor boards 130 are configured in parallel to each other and connected orthogonally on a rear surface of the middle plane 110. Each of the second processor boards 130 has at least one second processor (not shown) configured thereon. Optimum amount of processors on the first processor boards 120 or the second processor boards 130 might be 2, 4, 8 or 16 . . . .

One major feature of the SMP computer 100 is that the first processor boards 120 and the second processor boards 130 are crisscross to each other. Namely, as shown in FIGS. 1B and 2B, each of the four first processor boards 120 may form an "X" pattern with each of the four second processor boards 130 located on the other side of the middle plane 110. One optional structure is, as shown in FIGS. 1B and 2B, the first processor boards 120 and the second processor boards 130 are located parallel to the two "diagonal" orientations of the middle plane 110 respectively. Namely, in FIG. 1B, the four first processor boards 120 are parallel to the diagonal from the right upper corner to the left lower corner of the middle plane 110. Oppositely, the four second processor boards 130 are parallel to the diagonal from the left upper corner to the right lower corner of the middle plane 110. Another optional structure is that the first processor boards 120 are perpendicular to the second processor boards 130.

To electrically and operatively connect the first processor boards 120 onto the middle plane 110, plural (16 for the first embodiment) front connectors 111 are configured on the front surface of the middle plane 110 and arranged to form a front interconnection matrix (4×4 shown in FIGS. 1B and 2B). In the first embodiment, for example, two processors, a South Bridge and a BMC (baseboard management controller), all not shown, are configured on each of the first processor boards 120. Four first connectors 121 may be configured in a row at an edge of each of the first processor boards 120 to connect with a row of four of the front connectors 111 to communicate through the middle plane 110. All four first processor boards 120 require total 16 first connectors to interconnect with 16 corresponding front connectors on the middle plane 110.

Similarly, plural (16 for the first embodiment) rear connectors 112 are configured on the rear surface of the middle plane 110 and arranged to form a rear interconnection matrix (4×4 shown in FIGS. 1B and 2B). Two processors, a South Bridge and a BMC (all not shown), may also be configured on each of the second processor boards 130. Four second connectors 122 may be configured in a row at an edge of each of the second processor boards 130 to connect with a row of four of the rear connectors 112 to communicate through the middle plane 110. All four second processor boards 130 require total 16 second connectors to interconnect with 16 corresponding rear connectors on the middle plane 110.

Basically, the front interconnection matrix and the rear interconnection matrix form an interconnecting area at both sides of the middle plane 110, wherein the front connectors 111 and rear connectors 112 are placed in a star orthogonal pattern and become the core structure of the star interconnection architecture. To shorten the trace lengths and make as more interconnections as possible, the front interconnection matrix and the second interconnection matrix should be overlapped as more as possible. However, in one optional structure any of the front connectors 111 and any of the second connectors 112 are placed on opposite surfaces of the middle plane 110 without overlap.

To solve the cooling problem without using liquid cooling, as shown in FIGS. 1A, 1B, 2A and 2B, the SMP computer 100 further includes a cooling system (not marked) to provide sufficient airflows for the star interconnection architecture. The star interconnection architecture with the aforesaid specific enhanced interconnecting structure also provides an optimum push-pull scheme for airflows. The cooling system includes a first cooling module (not marked) with a first push fan 151 and a first pull fan 152 to generate plural first airflows 153; the cooling system also includes a second cooling module (not marked) with a second push fan 161 and a second pull fan 162 to generate plural second airflows 163.

In FIGS. 1A and 1B, the first push fan 151 at the left-lower corner of the SMP computer 100 vacuums cool air from the front side of the SMP computer 100 and then pushes upwards to generate the first airflows 153 at the left-lower side of the first processor boards 120. The cool first airflows 153 then passes through the parallel first processor boards 120 and flow by those first processors configured thereon. The warm first airflows 153 are also "pulled" by the first pull fan 152 and exit by the right-upper sides of the first processor boards 120. Next, the first pull fan 152 at the right-upper corner of the SMP computer 100 pull out the warm first airflows 153 backwards to the rear side of the SMP computer 100. For sure one or more guiding masks (not shown) may be used between the first push fan 151 and the left-lower side of the first processor boards 120, or between the right-upper sides of the first processor boards 120 to guide the generated airflows.

In FIGS. 2A and 2B, the second push fan 161 at the left-upper corner of the SMP computer 100 also vacuums cool air from the front side of the SMP computer 100 and then pushes downwards to generate the second airflows 163 at the left-upper side of the second processor boards 130. The cool second airflows 163 then passes through the parallel second processor boards 130 and flow by those second processors configured thereon. The warm first airflows 163 are also "pulled" by the second pull fan 162 and exit by the right-lower sides of the second processor boards 130. Next, the second pull fan 162 at the right-lower corner of the SMP computer 100 pull out the warm second airflows 163 backwards to the rear side of the SMP computer 100. For sure one or more guiding masks (not shown) may be used between the second push fan 161 and the left-upper side of the second processor boards 130, or between the right-lower sides of the second processor boards 130 to guide the generated airflows.

Since the paths of the first airflows 153 and the second airflows 163 follow the directions of the first processor boards 120 and the second processor boards 130, the paths of the first airflows 153 and the second airflows 163 are crisscross to each other at the opposite surfaces of the middle plane 110. This is the major feature of the cooling system implemented for the star interconnection architecture of the SMP computer 100. The types, sizes, rotation speeds, or the directions of airflow entrance and exit of all the fans used in the present invention should not be limited to the embodiments disclosed above and later.

Please refer to FIGS. 3A, 3B, 4A and 4B, which disclose a second embodiment of the present invention. A star interconnection architecture of a SMP computer 200 mainly includes a middle plane 210, plural first processor boards 220 and plural second processor boards 230, which are configured in a housing 240 as the way disclosed in the first embodiment. A cooling system of the SMP computer 200 is configured in the same way as well. One major difference between the first and second embodiments is that two T-boards 213, 214 are located at the top and bottom sides of the middle plane 210, or other sides theoretically practical. The T-boards 213, 214 are both T-shaped printed circuit boards. Both may be realized as independent parts that use edge-to-edge connections to interconnect with the middle plane 210, or simply become extension parts of the middle plan 210. The purposes of the T-boards 213, 214 are to provide system interconnections for storage, power, expansion cards, network interfaces and etc. Besides, since the T-boards 213, 214 form four opening at the positions of the fans of the cooling system, the T-boards 213, 214 will not block the airflows. The amount of the T-board for the SMP computer depends on the actual implementation. For some situations, one is enough. Moreover, the T-boards 213, 214 may be support boards without circuit and only configured for support purposes.

Figure 5:
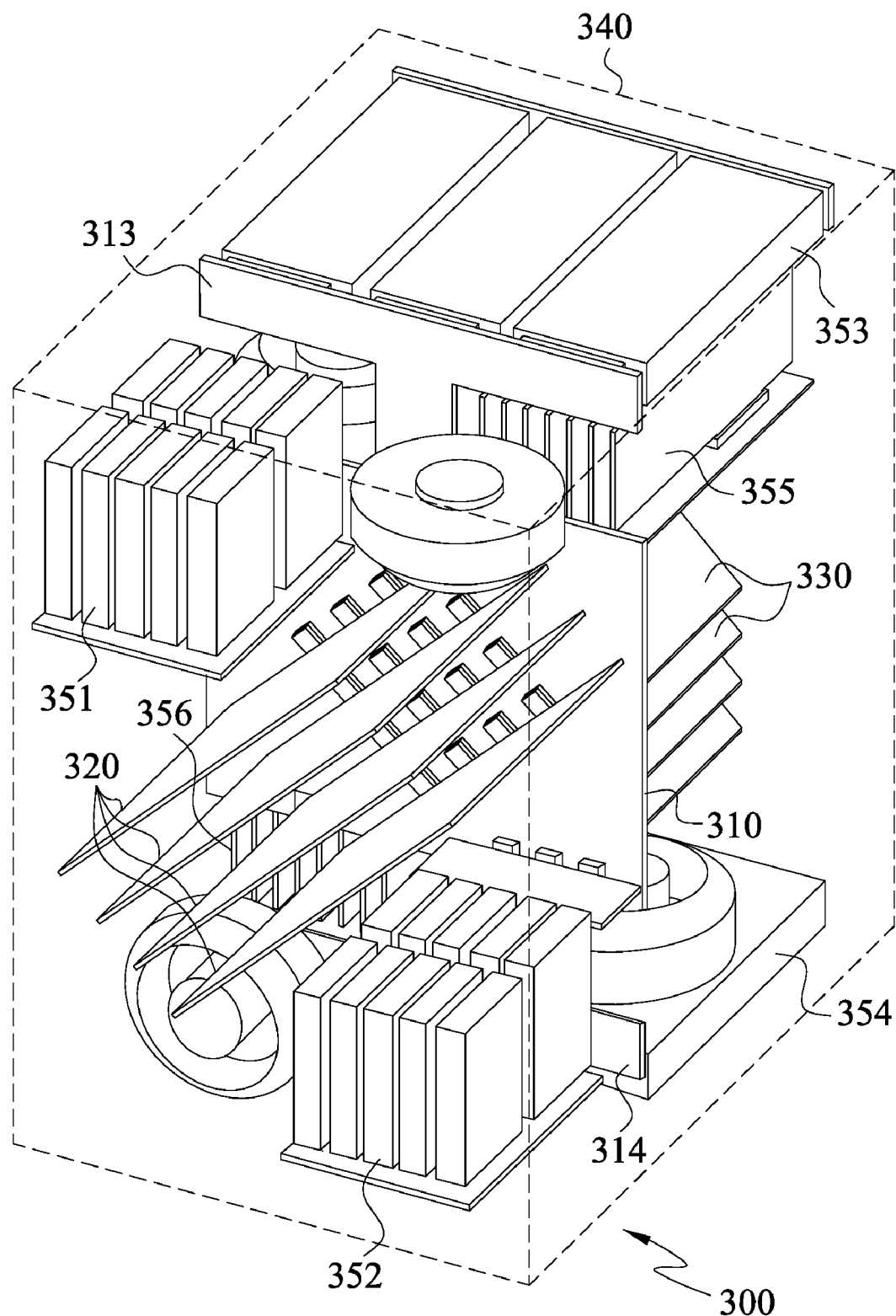
FIG. 5 is a schematic perspective view (front) for a third embodiment of the present invention, which illustrates another SMP computer with a star interconnection architecture and a cooling system configured thereof.
Figure 6:
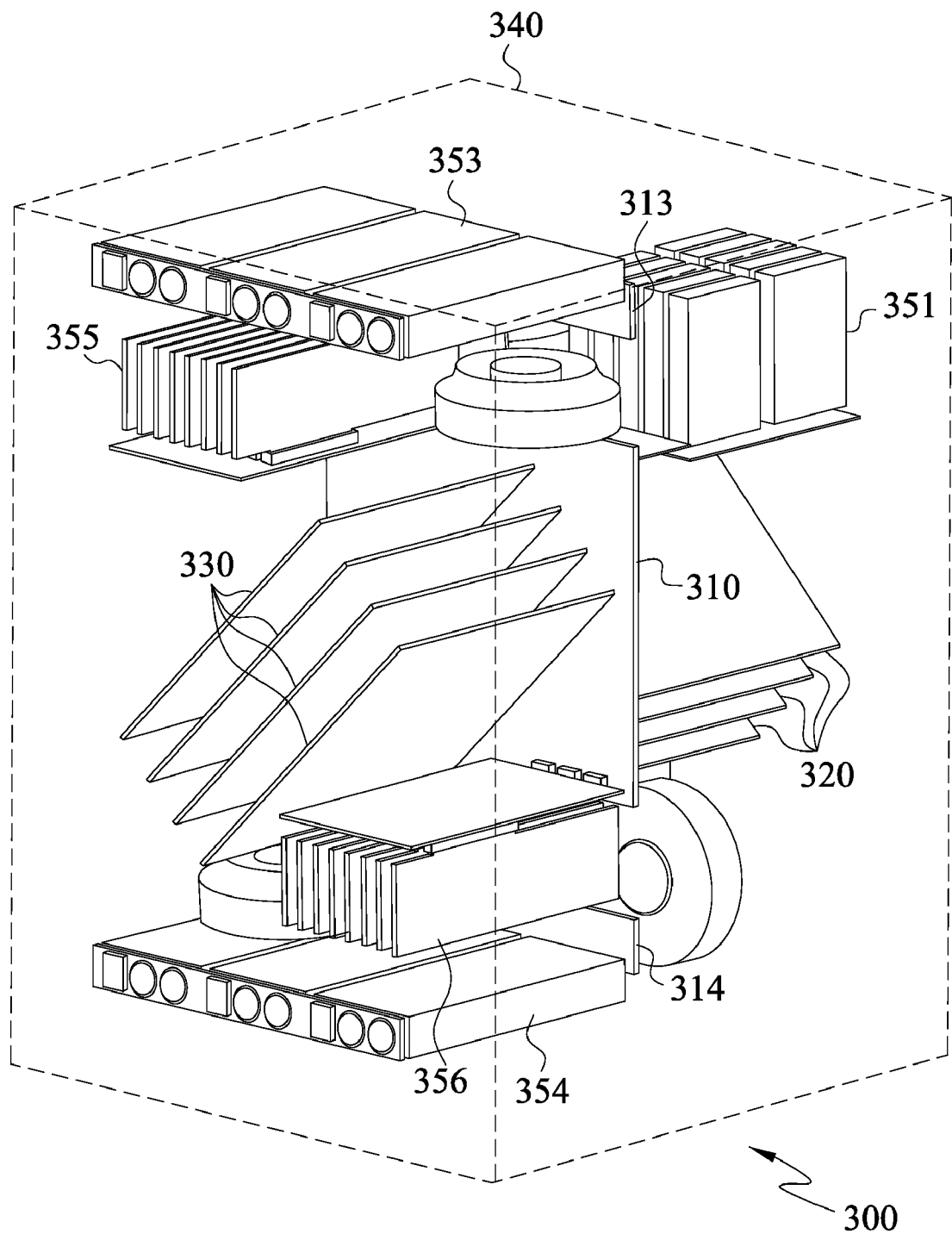
FIG. 6 is a schematic perspective view (rear) for the SMP computer illustrated in the third embodiment of the present invention.

Please refer to FIGS. 5 and 6. In the third embodiment, a star interconnection architecture of a SMP computer 300 mainly includes a middle plane 310, plural first processor boards 320, plural second processor boards 330 and two T-boards 313, 314, which are configured in a housing 340 as the way disclosed in the second embodiment. A cooling system of the SMP computer 300 is configured in the same way as well. In FIGS. 5 and 6, two hard disk modules 351, 352, two power supply modules 353, 354 and two expansion card modules 355, 356 are configured onto the star interconnection architecture. Certainly, sufficient support assemblies may be provided to position the hard disk modules 351, 352, the power supply modules 353, 354 and the expansion card modules 355, 356. Between each hard disk of the hard disk modules 351, 352, enough passages will be provided to avoid blocking the airflows. So do the expansion card modules 355, 356.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A symmetric multiprocessor computer, comprising:
    a housing;
    a middle plane configured in the housing;
    a plurality of first processor boards configured in parallel to each other and connected orthogonally onto a front surface of the middle plane, each having at least one first processors configured thereon; and
    a plurality of second processor boards configured in parallel to each other and connected orthogonally onto a rear surface of the middle plane, each having at least one second processors configured thereon;
    wherein the first processor boards and the second processor boards are crisscross to each other at the opposite surfaces of the middle plane, and wherein the first processor boards and the second processor boards are each disposed parallel to a respective diagonal bisection of the middle plane.

2. The symmetric multiprocessor computer of claim 1, wherein the first processor boards are perpendicular to the second processor boards.

3. The symmetric multiprocessor computer of claim 1, wherein the middles plane further comprises a plurality of front connectors and a plurality of rear connectors, the front connectors being configured on the front surface of the middle plane and arranged to form a first interconnection matrix, and the rear connectors being configured on the rear surface of the middle plane and arranged to form a second interconnection matrix.

4. The symmetric multiprocessor computer of claim 3, wherein the front connectors and the rear connectors are placed on opposite surfaces of the middle plane without overlap.

5. The symmetric multiprocessor computer of claim 3, wherein the front interconnection matrix and the second interconnection matrix are overlapped.

6. The symmetric multiprocessor computer of claim 1, wherein at least one T-board is located at one side of the middle plane, the T-board comprising a stem portion extending away from the middle plane and a top portion extending from the stem portion, wherein a width of the stem portion is less than a width of the middle plane and a width of the top portion is greater than the width of the stem portion so as to form a T-shape, and wherein two openings are defined between the top portion and middle plane respectively communicating the front surface and rear surface of the middle plane.

7. The symmetric multiprocessor computer of claim 6, wherein the T-board is a printed circuit board.

8. The symmetric multiprocessor computer of claim 1 further comprising a first cooling module and a second cooling system module for generating a plurality of first airflows and second airflows for the first processor boards and the second processor boards respectively, wherein the paths of the first airflows and the second airflows are crisscross to each other at the opposite surfaces of the middle plane.

9. A star interconnection architecture, comprising:
    a middle plane;
    a plurality of first processor boards configured in parallel to each other and connected orthogonally onto a front surface of the middle plane, each having at least one first processors configured thereon; and
    a plurality of second processor boards configured in parallel to each other and connected orthogonally onto a rear surface of the middle plane, each having at least one second processors configured thereon;
    wherein the first processor boards and the second processor boards are crisscross to each other at the opposite surfaces of the middle plane, and wherein the first processor boards and the second processor boards are each disposed parallel to a respective diagonal bisection of the middle plane.

10. The star interconnection architecture of claim 9, wherein the first processor boards are perpendicular to the second processor boards.

11. The star interconnection architecture of claim 9, wherein the middles plane further comprises a plurality of front connectors and a plurality of rear connectors, the front connectors being configured on the front surface of the middle plane and arranged to form a first interconnection matrix, and the rear connectors being configured on the rear surface of the middle plane and arranged to form a second interconnection matrix.

12. The star interconnection architecture of claim 11, wherein the front connectors and the rear connectors are placed on opposite surfaces of the middle plane without overlap.

13. The star interconnection architecture of claim 11, wherein the front interconnection matrix and the second interconnection matrix are overlapped.

14. The star interconnection architecture of claim 9 further comprising least one T-board located at one side of the middle plane, the T-board comprising a stem portion extending away from the middle plane and a top portion extending from the stem portion, wherein a width of the stem portion is less than a width of the middle plane and a width of the top portion is greater than the width of the stem portion so as to form a T-shape, and wherein two openings are defined between the top portion and middle plane respectively communicating the front surface and rear surface of the middle plane.

15. The star interconnection architecture of claim 14, wherein the T-board is printed circuit board.

16. The star interconnection architecture of claim 9, wherein a first cooling module and a second cooling system module are configured for generating a plurality of first airflows and second airflows for the first processor boards and the second processor boards respectively, wherein the paths of the first airflows and the second airflows are crisscross to each other at the opposite surfaces of the middle plane.

17. A cooling system for a star interconnection architecture, the star interconnection architecture having a middle plane, and a plurality of first processor boards and second processor boards configured orthogonally onto opposite surfaces of the middle plane, the first processor boards and the second processor boards being crisscross to each other at the opposite surfaces of the middle plane, the cooling system comprising a first cooling module and a second cooling system module configured for generating a plurality of first airflows and second airflows for the first processor boards and the second processor boards respectively, wherein the paths of the first airflows and the second airflows are crisscross to each other at the opposite surfaces of the middle plane, and wherein the first processor boards and the second processor boards are each disposed parallel to a respective diagonal bisection of the middle plane.

18. The cooling system of claim 17, wherein at least one T-board is located at one side of the middle plane, the T-board comprising a stem portion extending away from the middle plane and a top portion extending from the stem portion, wherein a width of the stem portion is less than a width of the middle plane and a width of the top portion is greater than the width of the stem portion so as to form a T-shape, and wherein two openings are defined between the top portion and middle plane respectively communicating the front surface and rear surface of the middle plane.

* * * * *